United States Patent
Azuma et al.

(10) Patent No.: US 11,742,365 B2
(45) Date of Patent: Aug. 29, 2023

(54) HIGH DYNAMIC RANGE IMAGE SENSOR HAVING REDUCED CROSSTALK AND JAGGY

(71) Applicant: OmniVision Technologies, Inc., Santa Clara, CA (US)

(72) Inventors: Takeo Azuma, Kyoto (JP); Chengming Liu, Fremont, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 133 days.

(21) Appl. No.: 17/373,080

(22) Filed: Jul. 12, 2021

(65) Prior Publication Data

US 2023/0010935 A1    Jan. 12, 2023

(51) Int. Cl.
| | | |
|---|---|---|
| *H01L 27/146* | (2006.01) | |
| *H04N 23/84* | (2023.01) | |
| *H04N 25/11* | (2023.01) | |
| *H04N 25/585* | (2023.01) | |

(52) U.S. Cl.
CPC .. *H01L 27/14607* (2013.01); *H01L 27/14645* (2013.01); *H04N 23/843* (2023.01); *H04N 25/11* (2023.01); *H04N 25/585* (2023.01)

(58) Field of Classification Search
CPC ........ H01L 27/14607; H01L 27/14645; H04N 5/35563; H04N 9/04515; H04N 9/0455
See application file for complete search history.

(56) References Cited

U.S. PATENT DOCUMENTS

| | | | |
|---|---|---|---|
| 8,643,132 B2 | 2/2014 | Chen et al. | |
| 9,666,631 B2 | 5/2017 | Lyu et al. | |
| 10,437,120 B1 | 10/2019 | Jutamulia et al. | |
| 2009/0135263 A1* | 5/2009 | Sorek | H04N 5/35581 |
| | | | 348/222.1 |
| 2020/0099874 A1* | 3/2020 | Hwang | H04N 5/3745 |
| 2020/0266827 A1* | 8/2020 | Sauerbrey | H03K 5/24 |
| 2020/0314362 A1* | 10/2020 | Roh | H04N 5/37457 |

* cited by examiner

*Primary Examiner* — Gevell V Selby

(57) ABSTRACT

An image sensor has a plurality of pixels arranged in a row direction and in a column direction. Each pixel comprises a color filter that has a portion with a low transmissivity and a portion with a high transmissivity, and a photoelectric conversion element that includes a first photoelectric conversion cell which receives light transmitting through the portion with the low transmissivity of the color filter, and a second photoelectric conversion cell which receives light transmitting through the portion with the high transmissivity of the color filter. The plurality of pixels are arranged such that positions of the portions with the low transmissivity for pixels of one color are identical among the plurality of pixels, and the portions with the low transmissivity are positioned adjacent to each other between adjacent pixels of different colors in the row direction only.

15 Claims, 6 Drawing Sheets

HIGH DYNAMIC RANGE IMAGE SENSOR HAVING REDUCED CROSSTALK AND JAGGY

FIELD OF THE INVENTION

The present invention relates to a high dynamic range image sensor, in particular, a high dynamic range image sensor having reduced crosstalk and jaggy.

BACKGROUND OF THE INVENTION

In an image sensor, a color filter is provided for each pixel, and an image signal of a corresponding color is acquired. As the color filter array, there is known a Bayer filter or the like.

A high dynamic range (HDR) imaging is proposed in which an exposure period is changed for each pixel, a transmissivity of the color filter is changed, or analog gain and/or digital gain are changed so as to acquire image signals having different sensitivities for one pixel, and to thereby improve a dynamic range.

When the transmissivity of the color filter is changed, an amount of light reception at a cell which receives transmitted light with a high transmissivity becomes large, resulting in a large amount of charges caused by a photoelectric conversion, and consequently, a problem of crosstalk due to overflow of the charges.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
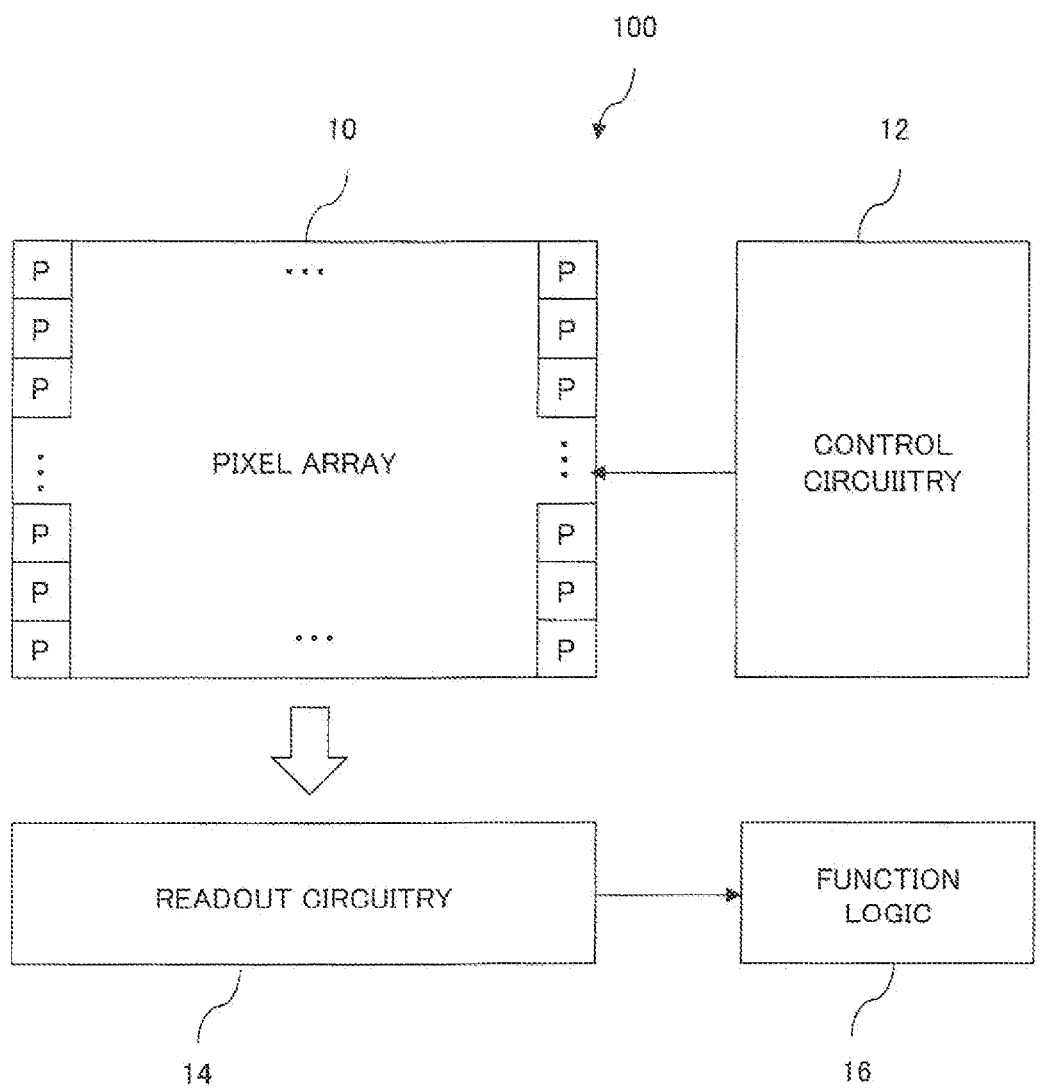
FIG. 1 is a block diagram showing a structure of an image sensor according to an embodiment of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable combinations and/or sub-combinations in one or more embodiments.

FIG. 1 is a block diagram showing a structure of an image sensor according to an embodiment of the present invention. An image sensor 100 of this example configuration comprises a pixel array 10, a readout circuitry 14, and a function logic 16.

The pixel array 10 is a two-dimensional array in which pixels P are arranged in rows and columns. Each pixel P includes a photoelectric conversion element which outputs an image signal corresponding to an amount of received light for each pixel, and forms a CMOS imaging element or an imaging sensor such as a CCD.

Each pixel P has a color filter on a light incidence side, and light of a particular color which has passed through the color filter is incident on the pixel P. In the illustrated example configuration, color filters of three colors of R, G, and B are used, and each pixel acquires an image signal corresponding to the incident light of one of the colors of R, G, and B.

A control circuitry 12 controls operations of the pixel array 10. For example, the control circuitry 12 controls an exposure period of each pixel P, an output of the image signal of each pixel P, or the like.

The readout circuitry 14 individually reads out the image signal of each pixel P, A/D converts the read signal to acquire digital data, and supplies the digital data to the function logic 16. Each pixel P is formed from a plurality of sub-pixels, and signals from these sub-pixels may be individually acquired.

The function logic 16 applies processes such as a demosaic process on the data from each pixel P, to acquire a video signal for screen display, and outputs the acquired video signal. The video signal may be supplied to a display. An image acquired by the image sensor 100 may be displayed on the display or further processed.

Figure 2:
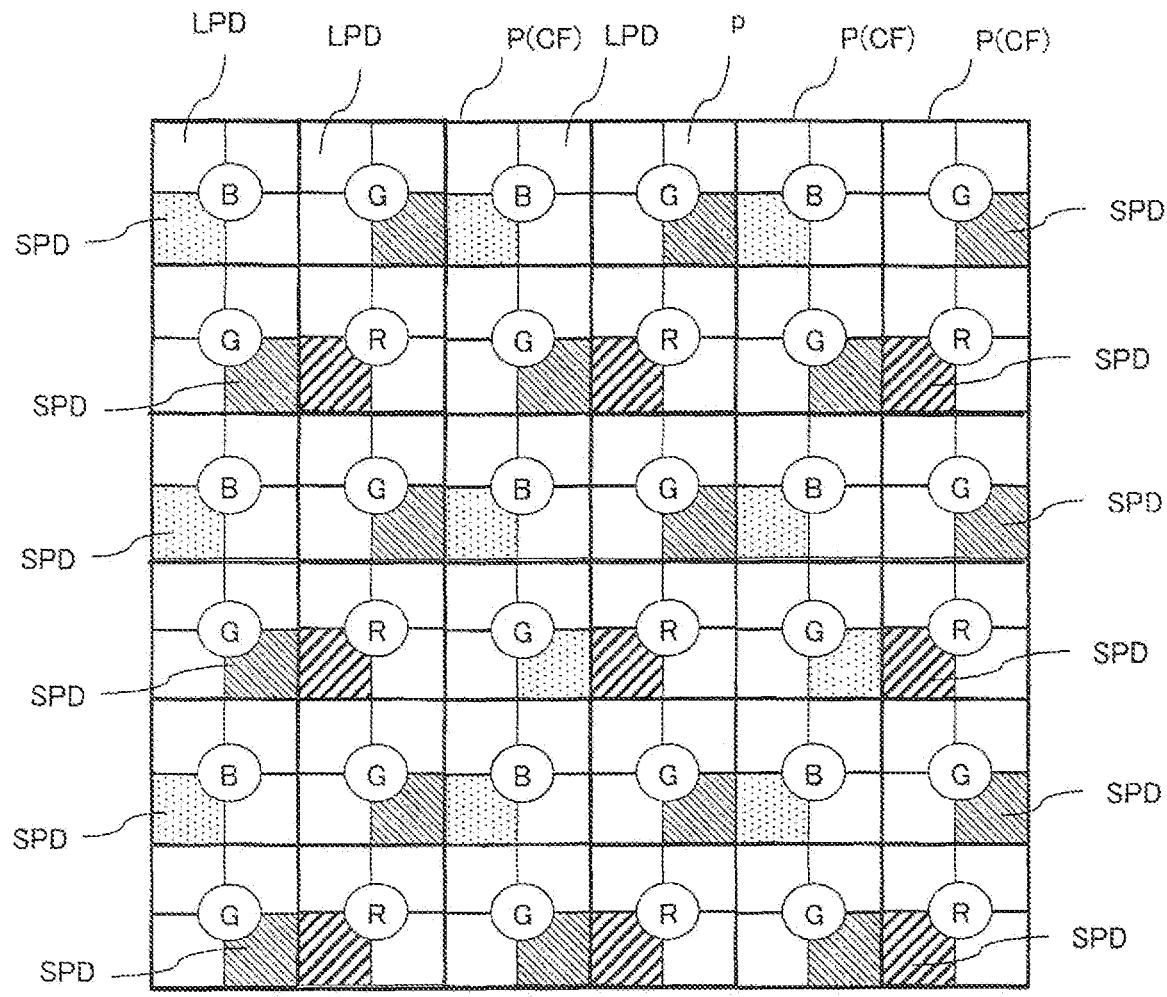
FIG. 2 is a diagram schematically showing a part of a pixel array.

FIG. 2 is a diagram schematically showing a part of the pixel array 10 of FIG. 1. FIG. 2 shows a preferred embodiment. In FIG. 2, a pixel P which is displayed as "R" is a pixel P in which a color filter CF of red is provided, a pixel P which is displayed as "G" is a pixel P in which a color filter CF of green is provided, and a pixel P which is displayed as "B" is a pixel P in which a color filter CF of blue is provided.

Figure 3:
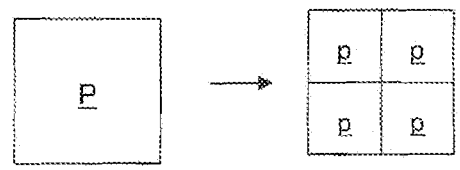
FIG. 3 is a diagram showing a pixel P and sub-pixels p.

As shown in FIG. 3, one pixel P is divided into four sub-pixels p. A photodiode is provided in each of the four sub-pixels p as a photoelectric conversion cell, and an image signal corresponding to an amount of incident light is acquired. Each pixel of the pixel array 10 comprises at least 2×2 sub-pixels.

Figure 4:
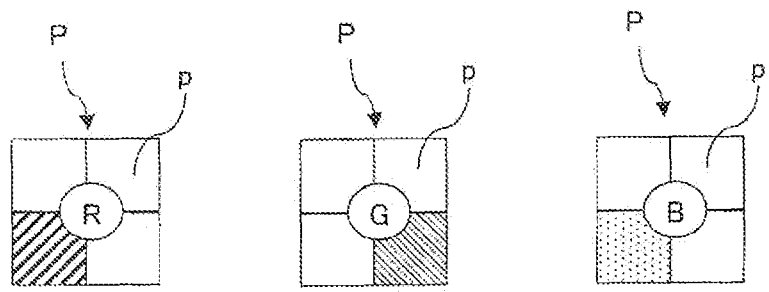
FIG. 4 is a diagram showing an example placement of an SPD sub-pixel in each of pixels of R, G, and B.
Figure 4:
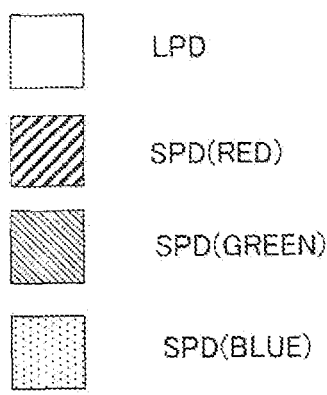

As shown in FIG. 4, three sub-pixels in one pixel P are formed as second photoelectric conversion cells (hereinafter, also referred to as "LPD" (Large Photo-Diode)), and a sensing with a high sensitivity is performed in these sub-pixels. One sub-pixel in one pixel P is formed as a first photoelectric conversion cell (hereinafter, also referred to as "SPD" (Small Photo-Diode)), and sensing with a low sensitivity is performed in this sub-pixel.

A photoelectric conversion element that is provided corresponding to each pixel, and that includes a first photoelectric conversion cell which receives light transmitting through the portion with the low transmissivity of the color filter, and a second photoelectric conversion cell which receives light transmitting through the portion with the high transmissivity of the color filter.

For example, in FIG. 4, in the pixel P of red, a bottom-left sub-pixel p among the four sub-pixels p is the SPD, in the pixel P of green, a bottom right sub-pixel p among the four sub-pixels p is the SPD, and, in the pixel P of blue, a bottom left sub-pixel p among the four sub-pixels p is the SPD.

Figure 5:
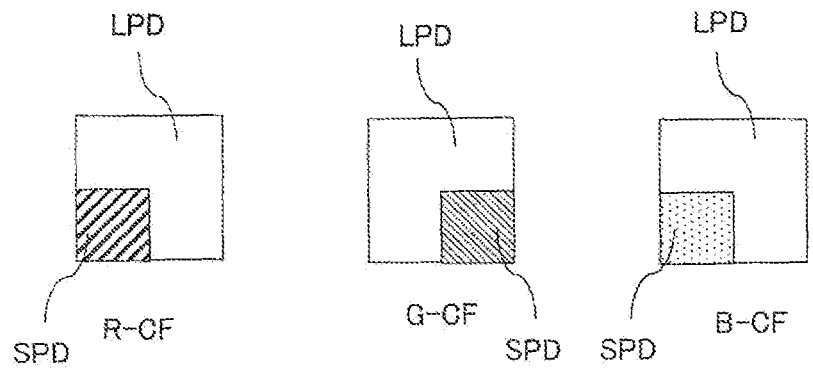
FIG. 5 is a schematic diagram showing an example structure of a color filter CF.

In this example configuration, as shown in FIG. 5 with a hatching, a transmissivity of the color filter CF is set relatively lower at a region corresponding to the SPD and is set relatively higher at a region corresponding to the LPD. Because of this, even with a same exposure period, an output of the LPD sub-pixel p is large, and an output of the SPD sub-pixel p is small.

As described, the transmissivities of the color filters CF are varied, to form the SPD sub-pixel p and the LPD sub-pixels p. Therefore, control of the exposure period for each sub-pixel or the like is not necessary, and an excessive switching is not necessary. Thus, occurrences of motion artifacts and flickers can be suppressed.

Referring again to FIG. 2, on one row (in the example configuration, odd rows 1, 3, 5, . . . ), blue pixels and green pixels are alternately placed, and on another row (in the example configuration, even rows 2, 4, 6, . . . ), green pixels and red pixels are alternately placed. A pixel in which a red color filter is provided is called an R pixel, a pixel in which a green color filter is provided is called a G pixel, and a pixel in which a blue color filter is provided is called a B pixel.

Because the B pixels and the R pixels are respectively placed every other row, and the G pixels are placed in every row, ratios of the pixels are 25% for the B pixels, 25% for the R pixels, and 50% for the G pixels.

In the G pixel, the SPD is placed at the bottom right, and in the R and B pixels, the SPD is placed at the bottom left. The positions of the SPD are identical for the same color pixels in the pixel array. Thus, in each row, the SPDs of adjacent pixels are arranged adjacent to each other. In addition, because the G pixels are provided with the position in the row direction shifted for each row, an overall checker-flag-like placement is realized. The G pixels are placed in uniform intervals in the row and column directions. In addition, the R and B pixels are positioned every other row and every other column in the row direction and in the column direction, and are thus also placed in uniform intervals in the row and column directions.

Accordingly, the SPDs of pixels of the same color are placed in uniform intervals in the row and column directions. In other words, an interval in the row direction and the column direction of the portions with low transmissivity for the pixels of each of the colors is a uniform interval.

In a preferred embodiment, a plurality of sub-pixels are formed in one pixel, and the signal of the one pixel is formed from signals from the sub-pixels. Therefore, a sampling position of the sub-pixel is desirably corrected by an interpolation calculation. That is, with re-sampling, a sampling position of the SPD sub-pixel and a sampling position of the LPD sub-pixel may be matched, to thereby prevent position deviation of a high frequency edge in the image after an HDR combining process. For example, data of peripheral pixels of the same color may be used to perform the interpolation calculation, to thereby correct the sampling position.

A sampling position of the SPD sub-pixels in one pixel may be corrected by an interpolation process. As an example, an interpolation position of the SPD in FIG. 2 may be set as a center of 2×2 sub-pixels to form a lattice point shape, so that the sampling position of the SPD may be approximately matched with a center-of-gravity position of the three LPD sub-pixels.

The positions of the SPD sub-pixel in a preferred embodiment in the 2×2 pixels differ between the case of the G pixel and the cases of the R and B pixels. That is, in the G pixel, the SPD is the bottom right sub-pixel of the 2×2 pixel, and, in R and B pixels, the SPD is the bottom left sub-pixel of the 2×2 pixel. Because of this, the center-of-gravity positions of the three LPD sub-pixels in a 2×2 pixel of one color differ between the G pixel and the R and B pixels. This difference also may be corrected by applying the re-sampling process by the interpolation calculation for the data of the LPD of the same color including the peripheral pixels, to set the sampling position at the center of the pixel and to match the sampling position with the re-sampling position of the SPD. Thus, the sampling position of the LPD is corrected by an interpolation process to match the sampling position of the SPD.

Here, a two-dimensional interpolation calculation may be performed using a known interpolation method such as a bicubic interpolation, a bilinear interpolation, and the like. In a preferred embodiment, the interpolation calculation is performed using the data of the LPD of the same color and the data of the SPD of the same color.

As described, in a preferred embodiment, of four sub-pixels p of a 2×2 pixel P, only the SPD sub-pixel has a lower transmissivity of the color filter. A 2×2 pixel P has the same meaning as a pixel P having 2×2 sub-pixels p. In the three remaining LPD sub-pixels, color filters with a high transmissivity are placed. The three LPD sub-pixels may be driven with two or three different exposure conditions. As a result, with the four sub-pixels in 2×2 pixel P including three LPD sub-pixels and one SPD sub-pixel, images can be captured with three or four different exposure conditions.

In this manner, a multiplex exposure images captured with different exposure conditions may be acquired. In the function logic 16 at the downstream, combining and other processes such as tone mapping may be applied to the acquired multiplex exposure images, to acquire an HDR image.

With the HDR imaging, the dynamic range can be widened, and it becomes possible to capture an image of a scene, in which a dark portion may be blocked up or a bright portion may be saturated in white (blown out highlight) under a single condition, without the blocked up shadows or the blown out highlights, and to display the captured image on the display.

In a preferred embodiment, the transmissivity of the color filter corresponding to the LPD sub-pixel is high. Because of this, the amount of charges generated by the photoelectric conversion at the LPD sub-pixel is great, and charges overflowing from these sub-pixels tend to easily flow into the adjacent SPD sub-pixel, which results in a tendency of occurrence of the crosstalk.

A crosstalk between pixels of the same color can in many cases be corrected by a subsequent signal processing. However, a crosstalk between signals of different colors are in many cases difficult to be corrected. This is because, when the crosstalk occurs between different colors, a color phase changes and a white balance changes, resulting in a difficulty of the correction.

In a preferred embodiment, pixels adjacent to each other in the row direction and in the column direction have colors different from each other. In addition, a sub-pixel of a pixel adjacent in the row direction to the SPD sub-pixel of one pixel is always the SPD sub-pixel. However, a sub-pixel of a pixel adjacent in the column direction to the SPD sub-pixel of one pixel is not the SPD sub-pixel. In other words, the SPD sub-pixel of one pixel is adjacent to the SPD sub-pixel of another pixel adjacent in the row direction only. Therefore, occurrence of the crosstalk between the SPD sub-pixel of one color and the LPD sub-pixel of another color can be suppressed.

Figure 6:
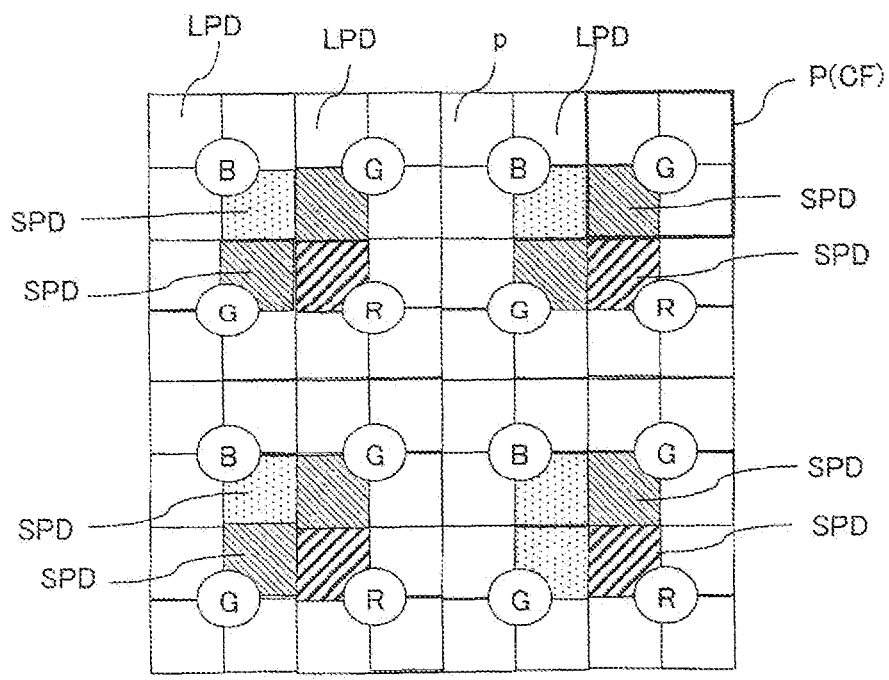
FIG. 6 is a diagram showing an example placement in which SPD sub-pixels are placed adjacent to each other.

As a countermeasure against the crosstalk described above, a configuration may be considered in which the SPD sub-pixels are placed in a collective manner for each group of 2×2 pixels, as shown in FIG. 6. With this placement, the SPD sub-pixel of one pixel is adjacent to the SPD sub-pixel of a pixel of another color in both the row direction and the column direction, and is not adjacent to the LPD sub-pixel of another color.

When the structure of FIG. 6 is employed, the crosstalk with respect to the SPD sub-pixel can be reduced. However, in this placement, the interval of the SPD sub-pixels of the G pixels is not uniform. With this configuration, a problem may arise in which a jaggy occurs in a demosaic-processed color image.

Figure 7:
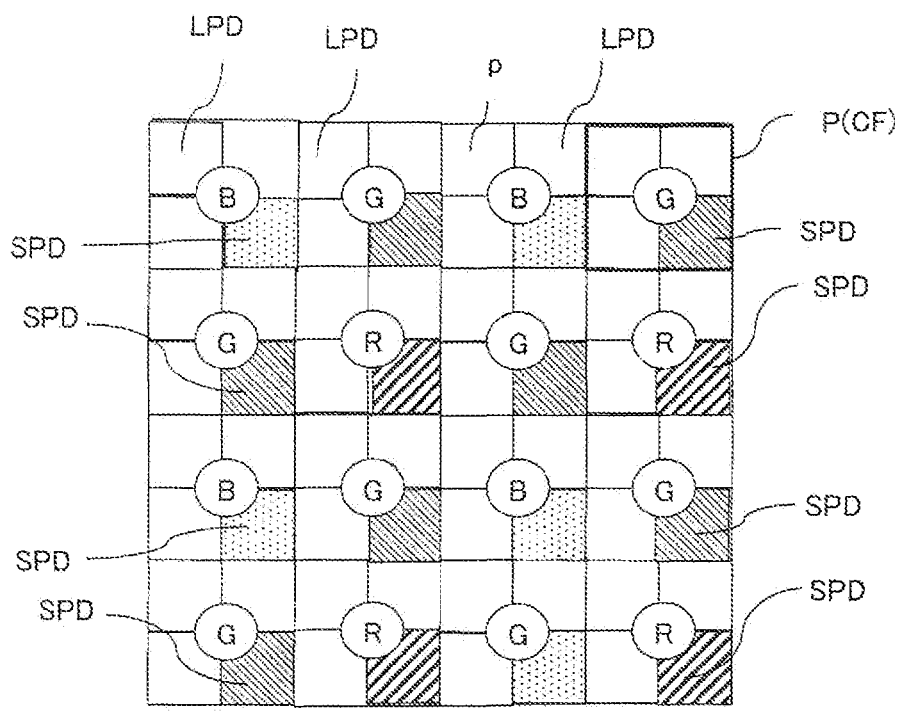
FIG. 7 is a diagram showing an example placement in which SPD sub-pixels are placed in an isolated manner.

On the other hand, in order to achieve the uniform interval of the positions of the SPD sub-pixels, for example, as shown in FIG. 7, a configuration may be employed in which the positions of the SPD sub-pixels in a pixel are set at the identical position. However, in this placement, sub-pixels adjacent to the SPD sub-pixel of one pixel in the row direction and in the column direction are LPD sub-pixels of other colors. Therefore, the problem of crosstalk becomes more significant.

In a preferred embodiment, the sub-pixel adjacent to the SPD sub-pixel of one pixel in the row direction is the SPD sub-pixel. Further, as described above, the interpolation calculation is performed to correct the sampling position of the SPD sub-pixel.

With this configuration (e.g., FIG. 2), the influences of the crosstalk may be suppressed in comparison to an isolated SPD sub-pixel placement (e.g., FIG. 7), and the jaggy, caused by a non-uniform sampling of the G sub-pixel when the SPDs are placed in adjacent units of four pixels in the 2×2 arrangement (e.g., FIG. 6), may be suppressed. Thus, an image quality degradation due to the crosstalk and an image quality degradation due to the jaggy can both be simultaneously reduced.

In an embodiment, the sub-pixels of a 2×2 pixel may be placed under a color filter of one color, and a photodiode may be provided corresponding to each sub-pixel. Accordingly, each pixel comprises one first photoelectric conversion cell and three second photoelectric conversion cells. In another embodiment, one photodiode is provided for the SPD sub-pixel, one photodiode is provided for the three LPD sub-pixels. In this case, each pixel comprises one first photoelectric conversion cell and one second photoelectric conversion cell. The amounts of incident light of the two photodiodes are separately photoelectrically converted and detected.

In this manner, as the exposure conditions differ from each other between the SPD sub-pixel and the LPD sub-pixel, the dynamic range may be widened, and, as a consequence, images of different ranges of the amount of incident light which can be photoelectrically converted without causing the blown out highlights and blocked up shadows can be input.

In particular, because the color filter of the LPD sub-pixel has a higher transmissivity than the color filter of the SPD sub-pixel, an image with a higher sensitivity (a signal in which a larger amount of charges are accumulated for the same imaging subject) may be acquired from the LPD sub-pixel than from the SPD sub-pixel. Further, for the LPD sub-pixel, a short-period exposure by an electric shutter may be performed during a horizontal retrace period, so that an image of a lower sensitivity (a signal in which a smaller amount of charges are accumulated for the same imaging subject) than from the SPD sub-pixel can be acquired.

Moreover, by changing a charge-to-voltage conversion gain of the LPD sub-pixel, for example, to have two levels including a high level and a low level, a number of exposure conditions can be increased. This configuration allows imaging with three or more exposure conditions, with the signal of the SPD sub-pixel, and the signal of the short-period exposure by the LPD sub-pixel.

The sensitivity of the image signal acquired by the short-period exposure of the LPD sub-pixel may be set to be higher or lower than the sensitivity of the image signal acquired by the SPD sub-pixel, depending on a length of the exposure period. Furthermore, a configuration may be employed in which an image signal having a higher sensitivity than any of a plurality of image signals acquired by the LPD sub-pixels is acquired by adjusting the exposure period of the SPD sub-pixel.

As described, the dynamic range can be widened by varying the exposure conditions in the sub-pixels in a variety of ways.

Figure 8:
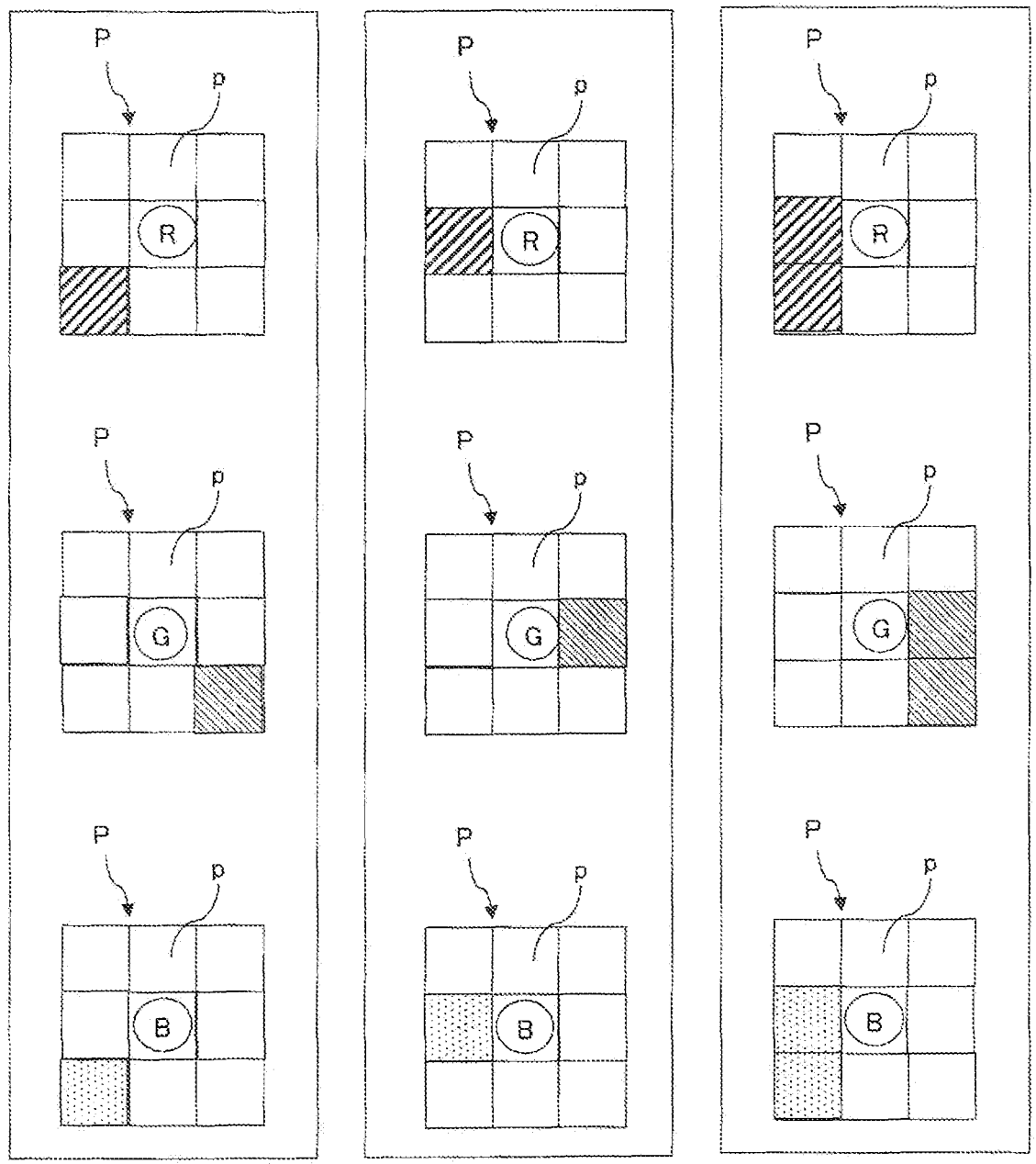
FIG. 8 is a diagram showing an example placement of SPD sub-pixels in a 3×3 pixel.

FIG. 8 shows an example placement of the SPD sub-pixel when one pixel is formed from 3×3 sub-pixels. In FIG. 8, a sub-pixel p displayed with a hatching is the SPD sub-pixel.

In an example configuration at the left, the SPD sub-pixels are placed at the bottom right for the G pixel, and at the bottom left for the R and B pixels. In the example configuration at the center, the SPD sub-pixels are placed at the middle right for the G pixel and at the middle left for the R and B pixels. In the example configuration at the right, the SPD sub-pixels are placed at the middle right and the bottom right for the G pixel, and at the middle left and the bottom left for the R and B pixels.

With these placements also, an advantage similar to that described above may be realized. Further, in these placements, the upper and lower positions and the left and right positions, or the like may be switched. Moreover, various modifications are possible in accordance with the principle of the present invention.

While the present invention has been described herein with respect to the exemplary embodiments and the best mode for practicing the invention, it will be apparent to one of ordinary skill in the art that many modifications, improvements and sub-combinations of the various embodiments, adaptations and variations can be made to the invention without departing from the spirit and scope thereof.

The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An image sensor which has a plurality of pixels arranged in a row direction and in a column direction, and which generates an image signal, the image sensor comprising:
   a color filter that is provided corresponding to each pixel, that allows light of one color to pass through, and that has a portion with a low transmissivity and a portion with a high transmissivity; and
   a photoelectric conversion element that is provided corresponding to each pixel, and that includes a first photoelectric conversion cell which receives light transmitting through the portion with the low transmissivity of the color filter, and a second photoelectric conversion cell which receives light transmitting through the portion with the high transmissivity of the color filter; wherein
   the plurality of pixels are arranged such that positions of the portions with the low transmissivity for pixels of one color are identical among the plurality of pixels, and the portions with the low transmissivity are positioned adjacent to each other between adjacent pixels of different colors in the row direction only; and
   each pixel comprises at least 2×2 sub-pixels.

2. The image sensor according to claim 1, wherein an interval in the row direction and the column direction of the portions with low transmissivity for the pixels of each of the colors is a uniform interval.

3. The image sensor according to claim 1, wherein the color filters include three types including R, G, and B, and one R pixel, one B pixel, and two G pixels are provided in four pixels which are adjacent to each other, and in one row, the B pixels and the G pixels are alternately arranged, and, in a next row, the G pixels and the R pixels are alternately arranged.

4. The image sensor according to claim 1, wherein a sampling position of the first photoelectric conversion cell in one pixel is corrected by an interpolation process.

5. The image sensor according to claim 4, wherein a sampling position of the second photoelectric conversion cell in one pixel is corrected by an interpolation process to match the sampling position of the first photoelectric conversion cell.

6. The image sensor according to claim 4, wherein the interpolation process includes bicubic interpolation and a bilinear interpolation.

7. The image sensor according to claim 1, wherein three second photoelectric conversion cells of a pixel having 2×2 photoelectric conversion cells are driven with two or three different exposure conditions.

8. The image sensor according to claim 7, wherein an image is captured with three or four different exposure conditions.

9. The image sensor according to claim 8, wherein a tone mapping is applied to an acquired multiplex exposure image.

10. The image sensor according to claim 1, wherein each pixel comprises one first photoelectric conversion cell and three second photoelectric conversion cells.

11. The image sensor according to claim 1, wherein each pixel comprises one first photoelectric conversion cell and one second photoelectric conversion cell.

12. The image sensor according to claim 1, wherein a charge-to-voltage conversion gain of the second photoelectric conversion cell has two levels including a high level and a low level.

13. The image sensor according to claim 3, wherein each pixel comprises 3×3 photoelectric conversion cells, the first photoelectric conversion cells are placed at a bottom right for the G pixel, and at a bottom left for the R and B pixels.

14. The image sensor according to claim 3, wherein each pixel comprises 3×3 photoelectric conversion cells, the first photoelectric conversion cells are placed at a middle right for the G pixel and at a middle left for the R and B pixels.

15. The image sensor according to claim 3, wherein each pixel comprises 3×3 photoelectric conversion cells, the first photoelectric conversion cells are placed at a middle right and a bottom right for the G pixel, and at the middle left and the bottom left for the R and B pixels.

* * * * *